United States Patent
Oh et al.

(10) Patent No.: US 8,615,023 B2
(45) Date of Patent: Dec. 24, 2013

(54) APPARATUS AND METHOD FOR TRANSMITTING/RECEIVING DATA IN COMMUNICATION SYSTEM

(75) Inventors: Jong-Ee Oh, Daejeon (KR); Sok-Kyu Lee, Daejeon (KR); Min-Ho Cheong, Daejeon (KR); Jee-Yon Choi, Daejeon (KR); Jae-Woo Park, Daejeon (KR); Hyun-Kyu Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 154 days.

(21) Appl. No.: 13/283,497

(22) Filed: Oct. 27, 2011

(65) Prior Publication Data

US 2012/0106575 A1    May 3, 2012

(30) Foreign Application Priority Data

Oct. 27, 2010  (KR) .......................... 10-2010-0105511
Oct. 26, 2011  (KR) .......................... 10-2011-0110110

(51) Int. Cl.
*H04J 3/24* (2006.01)
(52) U.S. Cl.
USPC .......................................... 370/474; 370/329

(58) Field of Classification Search
None
See application file for complete search history.

(56) References Cited

U.S. PATENT DOCUMENTS

| | | | |
|---|---|---|---|
| 2010/0011275 A1* | 1/2010 | Yang .............................. | 714/755 |
| 2010/0111232 A1* | 5/2010 | Papadopoulos et al. ...... | 375/340 |
| 2011/0096796 A1* | 4/2011 | Zhang et al. .................. | 370/474 |
| 2012/0106575 A1* | 5/2012 | Oh et al. ....................... | 370/474 |
| 2012/0327871 A1* | 12/2012 | Ghosh et al. .................. | 370/329 |

* cited by examiner

*Primary Examiner* — Robert Wilson

(57) ABSTRACT

Disclosed is an apparatus and method for transmitting/receiving data using a low-density parity check (LDPC) coding scheme in a communication system. The method includes generating a multi-user data packet containing data to be transmitted to a plurality of users, encoding the multi-user data packet as a BCC and an LDPC code, and transmitting the encoded multi-user data packet to the plurality of users. In the method, the encoding of the multi-user data packet encodes MPDU subframes corresponding to each of the plurality of users in the multi-user data packet as the LDPC code, and calculates information on a length in LDPC encoding, corresponding to the encoding of the multi-user data packet as the LDPC code.

20 Claims, 4 Drawing Sheets

APPARATUS AND METHOD FOR TRANSMITTING/RECEIVING DATA IN COMMUNICATION SYSTEM

CROSS-REFERENCES TO RELATED APPLICATIONS

The present application claims priority of Korean Patent Application Nos. 10-2010-0105511 and 10-2011-0110110, filed on Oct. 27, 2010, and Oct. 26, 2011, respectively, which are incorporated herein by reference in their entirety.

BACKGROUND OF THE INVENTION

1. Field of the Invention

Exemplary embodiments of the present invention relate to a communication system; and, more particularly, to an apparatus and method for transmitting/receiving data using a low-density parity check (hereinafter, referred to as 'LDPC') coding scheme in a communication system.

2. Description of Related Art

In current communication systems, various quality of service (hereinafter, referred to as 'QoS') services. In a wireless local area network (hereinafter, referred to as 'WLAN') system as an example of the communication systems, studies have been actively conducted to develop methods for stably transmitting a large quantity of data at a high speed through limited resources. Particularly, studies on data transmission through wireless channels have been conducted in the communication systems. Recently, there have been proposed plans for effectively transmitting/receiving a large quantity of data using limited wireless channels in the WLAN system.

Meanwhile, as it is required to develop a high-speed communication system capable of processing and transmitting a large quantity of data at a high speed through limited resources, e.g., wireless channels, it is essential to improve the efficiency of the system using an appropriate channel coding scheme. An unavoidable error occurs in data transmission according to channel environments in which the communication system exists, and therefore, loss of information occurs. Accordingly, a plan for encoding and decoding data using turbo codes and LDPC codes has been proposed as an example of plans for stably transmitting a large capacity of data at a high speed and reducing loss of information in the channel environments.

However, in the current communication systems, there has not been proposed a specific plan for coding and transmitting/receiving a data packet, e.g., multi-user data packet, containing a large quantity of data to be transmitted a plurality of users when the large quantity of data are transmitted to the plurality of users. That is, a specific plan for transmitting/receiving a multi-user data packet containing data to be transmitted to a plurality of user using an LDPC coding scheme does not exist in the communication system.

Therefore, in order to transmit a large quantity of data to a plurality of users in a communication system, it is required to develop a method in which a multi-user data packet is encoded and decoded using an LDPC coding scheme, so that it is possible to stably transmit/receive a multi-user data packet containing a large quantity of data at a high speed and to reduce loss of information in a channel environment.

SUMMARY OF THE INVENTION

An embodiment of the present invention is directed to an apparatus and method for transmitting/receiving data in a communication system.

Another embodiment of the present invention is directed to an apparatus and method for transmitting/receiving a multi-user data packet containing a large quantity of data to be transmitted to a plurality of users using an LDPC coding scheme through limited resources in a communication system.

Another embodiment of the present invention is directed to an apparatus and method for transmitting/receiving a large quantity of data to be transmitted to a plurality of users using an LDPC coding scheme in a communication system so as to reduce loss of information in a channel environment and perform high-speed and stable transmission/reception.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, an apparatus for transmitting data in a communication system includes: a generation unit configured to generate, using a processor, a multi-user data packet containing data to be transmitted to a plurality of users, the multi-user data packet including a plurality of medium access control (MAC) protocol data unit (MPDU) subframes; an encoding unit configured to encode, using a processor, the multi-user data packet as a binary convolutional code (BCC) and a low-density parity check (LDPC) code; and a transmission unit configured to transmit the encoded multi-user data packet to the plurality of the users. In the apparatus, the encoding unit encodes an MPDU subframe in the multi-user data packet, which corresponds to each of the plurality of users in the multi-user data packet to the LDPC code.

In accordance with another embodiment of the present invention, an apparatus for receiving data in a communication system includes: a reception unit configured to receive a multi-user data packet containing data to be transmitted to a plurality of users; a decoding unit configured to decode, using a processor, the multi-user data packet based on a BCC and an LDPC code; and a recovery unit configured to recover, using a processor, the decoded multi-user data packet to data corresponding to the plurality of users. In the apparatus, the decoding unit decodes the multi-user data packet in which an MPDU subframe corresponding to each of the plurality of users are encoded to the LDPC code.

In accordance with another embodiment of the present invention, a method for transmitting data in a communication system includes generating a multi-user data packet containing data to be transmitted to a plurality of users; encoding the multi-user data packet as a BCC and an LDPC code; and transmitting the encoded multi-user data packet to the plurality of users. In the method, the encoding of the multi-user data packet encodes MPDU subframes corresponding to each of the plurality of users in the multi-user data packet as the LDPC code, and calculates information on a length in LDPC encoding, corresponding to the encoding of the multi-user data packet as the LDPC code.

In accordance with another embodiment of the present invention, a method for receiving data in a communication system includes receiving a multi-user data packet containing data to be transmitted to a plurality of users; decoding the multi-user data packet, corresponding to a BCC and an LDPC code; and recovering the decoded multi-user data packet to data corresponding to the plurality of users. In the method, the decoding of the multi-user data packet decodes the multi-user data packet, in which MPDU subframes corresponding to each of the plurality of users are encoded as the LDPC code, using information a length in LDPC encoding, corresponding to the encoding of the multi-user data packet as the LDPC code.

DESCRIPTION OF SPECIFIC EMBODIMENTS

Figure 1:
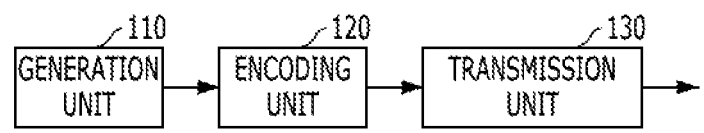
FIG. 1 is a schematic block diagram illustrating a data transmitting apparatus in a communication system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present invention proposes an apparatus and method for transmitting/receiving data in a communication system, e.g., a wireless local area network (hereinafter, referred to as 'WLAN') system. In exemplary embodiments of the present invention, the WLAN system is described as an example of the communication system. However, the apparatus and method proposed in the present invention may be applied to other communication systems.

In the exemplary embodiments of the present invention, there is proposed an apparatus and method for transmitting/receiving a large quantity of data to be transmitted to a plurality of users, e.g., a multi-user data packet through limited resources, e.g., wireless channels in a communication system so as to reduce loss of information in a channel environment and perform high-speed and stable transmission/reception. Here, the frame of the multi-user data packet is a physical layer convergence procedure (PLCP) protocol data unit (hereinafter, referred to as a 'PPDU'), and includes a physical (PHY) service data unit (hereinafter, referred to as a 'PSDU') and a padding data unit.

In the exemplary embodiments, the PSDU in the frame of the multi-user data packet is encoded and decoded through a low-density parity check (hereinafter, referred to as 'LDPC') coding scheme, thereby transmitting/receiving the multi-user data packet. Particularly, in the PSDU of the multi-user data packet, a medium access control (MAC) protocol data unit (hereinafter, referred to as 'MPDU') subframe is encoded and decoded using the LDPC coding scheme. Hereinafter, an apparatus for transmitting data in a communication system in an embodiment of the present invention will be described in detail with reference to FIG. 1.

FIG. 1 is a schematic block diagram illustrating a data transmitting apparatus in a communication system in accordance with an embodiment of the present invention.

Referring to FIG. 1, the data transmitting apparatus includes a generation unit 110, an encoding unit 120 and a transmission unit 130. The generation unit 110 generates a multi-user data packet containing a large quantity of data to be transmitted to a plurality of users. The encoding unit 120 encodes the multi-user data packet generated by the generation unit 110. The transmission unit 130 transmits the multi-user data packet encoded by the encoding unit 120 to data receiving apparatuses of the plurality of users.

The generation unit 110 generates a multi-user data packet containing a large quantity of data corresponding to a communication service to be provided to the plurality of users, and the frame of the generated multi-user data packet is a PPDU, and includes a PSDU and a padding data unit. The multi-user data packet will be described below with reference to FIGS. 3 to 6, and therefore, its detailed description will be omitted.

The encoding unit 120 encodes the multi-user data packet generated by the generation unit 110 using a predetermined coding scheme. For example, the multi-user data packet is encoded through a binary convolutional code (hereinafter, referred to as a 'BCC') and an LDPC code. Particularly, in the frame of the multi-user data packet, an MPDU subframe is encoded as the LDPC code. The encoding of the multi-user data packet will be described in detail below with reference to FIGS. 3 to 6, and therefore, its detailed description will be omitted.

The transmission unit 130 transmits the multi-user data packet encoded by the encoding unit 120, i.e., the multi-user data packet encoded as the BCC and the LDPC code to a data receiving apparatus included in a terminal of each of the plurality of users. In this case, the transmission unit 130 transmits information on length in LDPC encoding, corresponding to the LDPC encoding of the multi-user data packet in the encoding unit 120, to the data receiving apparatus. For the convenience of illustration, it has been described in the embodiment of the present invention that the data transmitting apparatus is included in an access point (hereinafter, referred to as 'AP') of the WLAN system and the data receiving apparatus is included in a terminal of the WLAN system. However, the data transmit/receiving apparatus may be included in other devices of a communication system. Hereinafter, a data receiving apparatus in the communication system in accordance with the embodiment of the present invention will be described in detail with reference to FIG. 2.

Figure 2:
FIG. 2 is a schematic block diagram illustrating a data receiving apparatus in the communication system in accordance with the embodiment of the present invention.

FIG. 2 is a schematic block diagram illustrating a data receiving apparatus in the communication system in accordance with the embodiment of the present invention.

Referring to FIG. 2, the data receiving apparatus includes a reception unit 210, a decoding unit 220 and a recovery unit 230. The reception unit 210 receives the multi-user data packet transmitted by the data transmitting apparatus. The decoding unit 220 decodes the multi-user data packet received by the reception unit 210. The recovery unit 230 recovers the multi-user data packet decoded by the decoding unit 220 and outputs data corresponding to each of the users.

The decoding unit 220 decodes the multi-user data packet received from the reception unit 210. In this case, the decoding unit 220 decodes the multi-user data packet corresponding to the coding scheme applied in the encoding unit 120 of the data transmitting apparatus. As the multi-user data packet is encoded as the LDPC code, the decoding unit 220 decodes the multi-user data packet using the information on the length in LDPC encoding. Here, the information on the length in LDPC encoding is received through the reception unit 210. The decoding of the multi-user data packet will be described in detail below with reference to FIGS. 3 to 6, and therefore, its detailed description will be omitted. Hereinafter, multi-user data packets and encoding/decoding in the communication system in accordance with the embodiment of the present invention will be described in detail with reference to FIGS. 3 to 6.

Figure 3:
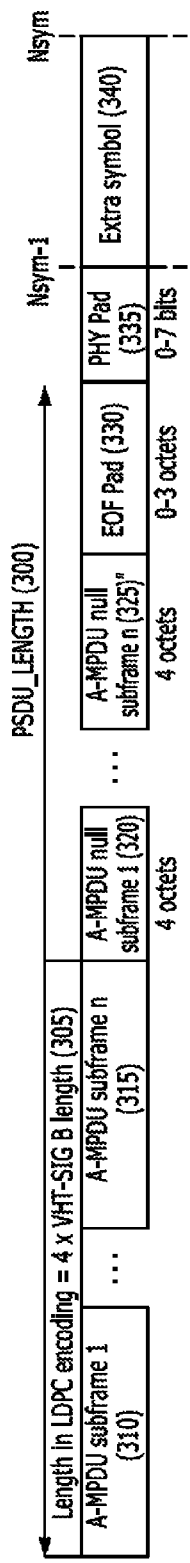
FIGS. 3 to 6 illustrate schematic structures of multi-user data packets in the communication system in accordance with the embodiment of the present invention.
Figure 4:
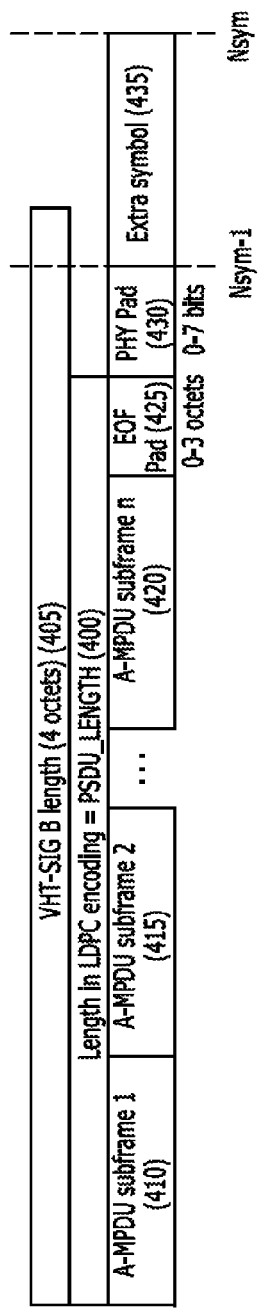
Figure 5:
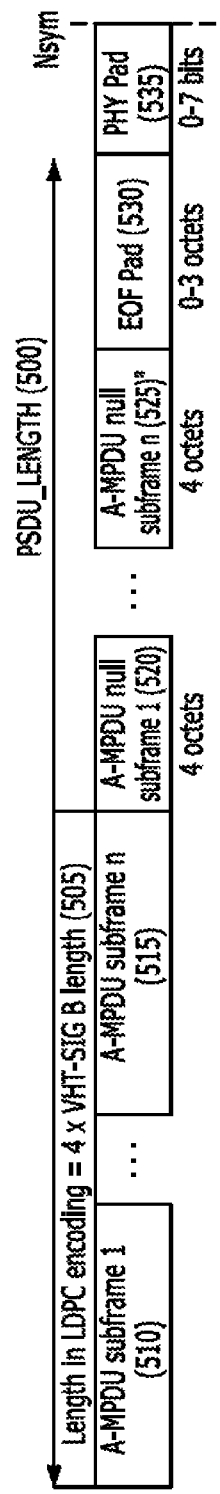
Figure 6:
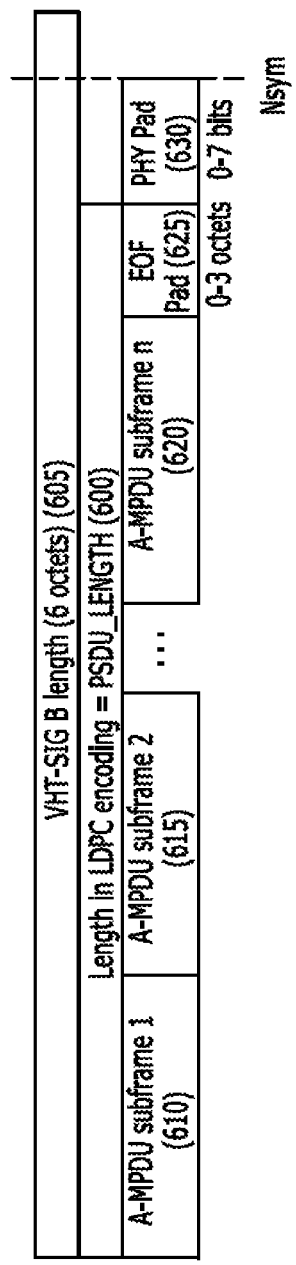

FIGS. 3 to 6 illustrate schematic structures of multi-user data packets in the communication system in accordance with the embodiment of the present invention. FIGS. 3 and 4 schematically illustrate frame structures of the multi-user data packet when an extra symbol, particularly an extra symbol composed of one or two symbols as an LDPC coding symbol is additionally used in the multi-user data packet. FIGS. 5 and 6 schematically illustrate frame structures of the multi-user data packet when the extra symbol, particularly the LDPC coding symbol is not used in the multi-user data packet.

Referring to FIG. 3, the multi-user data packet is an MPDU subframe corresponding to each of the plurality of users, e.g., n multiple users. For example, the multi-user data packet includes aggregated-MPDU (hereinafter, referred to as 'A-MPSU') subframes, i.e., a first A-MPDU subframe and an n-th A-MPDU subframe 315, data units respectively corresponding to the A-MPDU subframes 310 and 315, e.g., null subframes, i.e., a first A-MPDU null subframe 320 and an n-th A-MPDU null subframe 325, an end of frame (EoF) pad 330, a PHY pad 335 and an extra symbol 340 composed of one symbol.

In the multi-user data packet, the length of the PSDU PSDU_LENGTH 300 becomes the A-MPDU subframes 310 and 315, the A-MPDU null subframes 320 and 325 and the EOF pad 330, and the A-MPDU null subframes 320 and 325 and the EOF pad 330 become an MAC pad. Therefore, the encoding unit 120 encodes the multi-user data packet through the BCC and the LCPC code as the multi-user data packet includes the MAC pad and the PHY pad 335. Particularly, in the multi-user data packet, the encoding unit 120 encodes the A-MPDU subframes 310 and 315 through the LDPC code.

That is, the length in LDPC encoding, corresponding to the LDPC encoding of the multi-user data packet in the encoding unit 120, is a 4×very high throughput (VHT)-signal (hereinafter, referred to as 'SIG') B length (4×VHT-SIG B length) 305, and becomes the A-MPDU subframes 310 and 315. When decoding the multi-user data packet, the decoding unit 220 performs a decoding operation using information on the 4×VHT-SIG B length 305. In this case, since the 4×VHT-SIG B length 305 is identical to the length in LDPC encoding, the decoding unit 220 performs the decoding operation using information on the length in LDPC encoding.

Referring to FIG. 4, the multi-user data packet is an MPDU subframe corresponding to each of the plurality of users, e.g., n multiple users. For example, the multi-user data packet includes A-MPSU subframes, i.e., a first A-MPDU subframe 410 and an n-th A-MPDU subframe 415, an EOF pad 425, a PHY pad 430 and an extra symbol 435 composed of one symbol.

In the multi-user data packet, the length of the PSDU PSDU_LENGTH 400 becomes the A-MPDU subframes 410 and 415 and the EOF pad 425, and the EOF pad 425 becomes an MAC pad. Therefore, the encoding unit 120 encodes the multi-user data packet through the BCC and the LCPC code as the multi-user data packet includes the MAC pad and the PHY pad 430. Particularly, in the multi-user data packet, the encoding unit 120 encodes the A-MPDU subframes 410 and 415 and the EOF pad 425 through the LDPC code.

That is, the length in LDPC encoding, corresponding to the LDPC encoding of the multi-user data packet in the encoding unit 120, becomes the PSDU_LENGTH 400 as the A-MPDU subframes 410 and 415 and the EOF pad 425. Here, the 4×VHT-SIG B length 405 becomes more than the A-MPDU subframes 410 and 415, the EOF pad 425 and the PHY pad 430. When decoding the multi-user data packet, the decoding unit 220 performs a decoding operation not using information on the 4×VHT-SIG B length 405 but using information on the length in LDPC encoding, i.e., information on the PSDU_LENGTH 400.

As described above, FIGS. 3 and 4 illustrate structures of the multi-user data packet when the extra symbol 340 or 435 composed of one symbol is used in the LDPC encoding. Hereinafter, structures of the multi-user data packet when the extra symbol is not used in the LDPC encoding will be described in detail with reference to FIGS. 5 and 6.

Referring to FIG. 5, the multi-user data packet is an MPDU subframe corresponding to each of the plurality of users, e.g., n multiple users. For example, the multi-user data packet includes A-MPSU subframes, i.e., a first A-MPDU subframe 510 and an n-th A-MPDU subframe 515, padding data units of the A-MPDU subframes 510 and 515, e.g., null subframes, i.e., a first A-MPDU null subframe 520 and an n-th A-MPDU null subframe 525, an EOF pad 530, and a PHY pad 535.

In the multi-user data packet, the PSDU_LENGTH 500 becomes the A-MPDU subframes 510 and 515, the A-MPDU null subframes 520 and 525 and the EOF pad 530, and the A-MPDU null subframes 520 and 525 and the EOF pad 530 become an MAC pad. Therefore, the encoding unit 120 encodes the multi-user data packet through the BCC and the LCPC code as the multi-user data packet includes the MAC pad and the PHY pad 535. Particularly, in the multi-user data packet, the encoding unit 120 encodes the A-MPDU subframes 510 and 515 through the LDPC code.

That is, the length in LDPC encoding, corresponding to the LDPC encoding of the multi-user data packet in the encoding unit 120, is a 4×VHT-SIG B length 505, and becomes the A-MPDU subframes 510 and 515. When decoding the multi-user data packet, the decoding unit 220 performs a decoding operation using information on the 4×VHT-SIG B length 505. In this case, since the 4×VHT-SIG B length 505 is identical to the length in LDPC encoding, the decoding unit 220 performs the decoding operation using information on the length in LDPC encoding.

Referring to FIG. 6, the multi-user data packet is an MPDU subframe corresponding to each of the plurality of users, e.g., n multiple users. For example, the multi-user data packet includes A-MPSU subframes, i.e., a first A-MPDU subframe 610 and an n-th A-MPDU subframe 615, an EOF pad 625, and a PHY pad 630.

In the multi-user data packet, the PSDU_LENGTH 600 becomes the A-MPDU subframes 610 and 615 and the EOF pad 625, and the EOF pad 625 become an MAC pad. Therefore, the encoding unit 120 encodes the multi-user data packet through the BCC and the LCPC code as the multi-user data packet includes the MAC pad and the PHY pad 630. Particularly, in the multi-user data packet, the encoding unit 120 encodes the A-MPDU subframes 610 and 615 and the EOF pad 625 through the LDPC code.

That is, the length in LDPC encoding, corresponding to the LDPC encoding of the multi-user data packet in the encoding unit 120, becomes the PSDU_LENGTH 600 as the A-MPDU subframes 610 and 615 and the EOF pad 625. Here, the 4×VHT-SIG B length 605 becomes more than the A-MPDU subframes 610 and 615, the EOF pad 625 and the PHY pad 630. When decoding the multi-user data packet, the decoding unit 220 performs a decoding operation not using information on the 4×VHT-SIG B length 605 but using information on the length in LDPC encoding, i.e., information on the PSDU_LENGTH 600.

Hereinafter, the encoding/decoding through the LDPC code in the encoding unit 120 and the decoding unit 220 will be described in detail. The total number of symbols of the multi-user data packet, i.e., the total number $N_{SYM}$ of data symbols in the data portion of the packet is first calculated. Here, the maximum value $N_{SYM\_BCC}$ of the number of data symbols among BCC users is calculated so as to calculate the total number $N_{SYM}$ of data symbols in the data portion of the packet, and the maximum value $N_{SYM\_BCC}$ of the number of data symbols among the BCC users may be represented by Expression 1.

$$N_{SYM\_BCC} = \max\left\{ m_{STBC} \times \left\lceil \frac{8 \cdot LENGTH_u + 16 + 6 \cdot N_{ES,u}}{m_{STBC} \cdot N_{DBPS,u}} \right\rceil \right\}_{u=1}^{u=N_{USERS\_BCC}}$$

Expression 1

In Expression 1, $m_{STBC}$ denotes a space time block coding (STBC) parameter when the data transmitting apparatus transmits a multi-user data packet through multiple antennas, $N_{DBPS,u}$ denotes a number of data bits per symbol for each user u, $N_{ES,u}$ denotes a number of BCC encoders for each user, $LENGTH_u$ denotes a length parameter of a user defined by a transmission vector TXVECTOR of the data transmitting apparatus, and $N_{USERS\_BCC}$ denotes a total number of BCC users.

The maximum value $N_{SYM\_LDPC}$ of the number of data symbols among LDPC code users is calculated so as to calculate the total number of data symbols in the data portion of the packet $N_{SYM}$, and the maximum value $N_{SYM\_LDPC}$ of the number of data symbols among the LDCP code users may be represented by Expressions 2 and 3.

$$N_{SYM\_LDPC} = \max\left\{ m_{STBC} \times \left\lceil \frac{8 \cdot LENGTH_u + 16}{m_{STBC} \cdot N_{DBPS,u}} \right\rceil + 1 \right\}_{u=1}^{u=N_{USERS\_LDPC}}$$

Expression 2

$$N_{SYM\_LDPC} = \max\left\{ m_{STBC} \times \left\lceil \frac{8 \cdot LENGTH_u + 16}{m_{STBC} \cdot N_{DBPS,u}} \right\rceil + N_{SYM\_ext,u} \right\}_{u=1}^{u=N_{USERS\_LDPC}}$$

Expression 3

In Expressions 2 and 3, $N_{USERS\_LDPC}$ denotes a total number of LDPC code users. Expression 2 represents the maximum value $N_{SYM\_LDPC}$ of the number of data symbols among the LDPC code users when the extra symbol 340 or 435 composed of one symbol is used in the LDPC encoding as illustrated in FIGS. 3 and 4. Expression 3 represents the maximum value $N_{SYM\_LDPC}$ of the number of data symbols among the LDPC code users when the extra symbol composed of two or more symbols is used in the LDPC encoding.

Here, the $N_{SYM\_ext,u}$ has a value of 1 when the extra symbol 340 or 435 composed of one symbol is used in the LDPC encoding as illustrated in FIGS. 3 and 4. The $N_{SYM\_ext,u}$ has a value of 0 when the extra symbol is not used in the LDPC encoding as illustrated in FIGS. 5 and 6. In this case, the $N_{SYM\_ext,u}$ is determined based on whether or not the number $N_{punc,u}$ of puncturing bits exceeds an acceptable range in an IEEE 802.11n system as a WLAN system by performing LDPC encoding on a multi-user data packet for each user. That is, the $N_{SYM\_ext,u}$ uses the extra symbol 340 or 345 composed of one symbol, as illustrated in FIGS. 3 and 4, only when an extra symbol is needed in the LDPC encoding, and performs the LDPC encoding so as to calculate the total number $N_{SYM}$ of data symbols in the data portion of the packet.

If the maximum value $N_{SYM\_BCC}$ of the number of data symbols among BCC users and the maximum value $N_{SYM\_LDPC}$ of the number of data symbols among LDPC code users are calculated as described above, the maximum value among the calculated maximum values $N_{SYM\_BCC}$ and $N_{SYM\_LDPC}$ is determined as the total number $N_{SYM}$ of data symbols in the data portion of the packet. Here, the total number of symbols of the multi-user data packet, i.e., the total number $N_{SYM}$ of data symbols in the data portion of the packet may be represented by Expression 4.

$$N_{SYM} = \max\{N_{SYM\_BCC}, N_{SYM\_LDPC}\}$$

Expression 4

In Expression 4, the number $N_{LDPC\_ext,u}$ of LDPC code extra symbols of VHT-SIG A2, B3 is set to 1 only when the total number $N_{SYM}$ of data symbols in the data portion of the packet is identical to $$m_{STBC} \times \left( \left\lceil \frac{8 \cdot LENGTH_u + 16}{m_{STBC} \cdot N_{DBPS,u}} \right\rceil + N_{SYM\_ext,u} \right)$$

of Expression 3, calculated in a user of which number $N_{SYM\_ext,u}$ of extra symbols is 1 among the LDPC users. Otherwise, the number $N_{LDPC\_ext,u}$ of LDPC code extra symbols is set to 0.

Therefore, the PSDU length $PSDU\_LENGTH_u$ for each user, defined by a reception vector RXVECTOR of the data receiving apparatus may be represented by Expressions 5 to 7.

$$PSDU\_LENGTH_u = \left\lfloor \frac{N_{SYM} N_{DBPS,u} - 16 - 6 \cdot N_{ES,u}}{8} \right\rfloor$$

Expression 5

$$PSDU\_LENGTH_u = \left\lfloor \frac{(N_{SYM} - m_{STBC}) \cdot N_{DBPS,u} - 16}{8} \right\rfloor$$

Expression 6

$$PSDU\_LENGTH_u = \left\lfloor \frac{N_{SYM} N_{DBPS,u} - 16}{8} \right\rfloor$$

Expression 7

Expression 5 represents a PSDU length $PSDU\_LENGTH_u$ of a BCC user. Expressions 6 and 7 represent a PSDU length $PSDU\_LENGTH_u$ of an LDPC code user. Expression 6 represents a PSDU length $PSDU\_LENGTH_u$ of an LDPC code user when the number $N_{LDPC\_ext,u}$ of LDPC code extra symbols of VHT-SIG A2, B3 is set to 1, as described above. Expression 7 represents a PSDU length $PSDU\_LENGTH_u$ of an LDPC code user when the number $N_{LDPC\_ext,u}$ of LDPC code extra symbols of VHT-SIG A2, B3 is set to 0.

Hereinafter, the LDPC encoding of a multi-user data packet in the encoding unit 120, i.e., an LDPC PPDU encoding process will be described in detail. The encoding unit 120 calculates a number $N_{avbits,u}$ of available bits in the minimum number of orthogonal frequency division multiplexing (OFDM) symbols for each user in the multi-user data packet. In this case, the encoding unit 120 calculates a number $N_{pld,u}$ of data pad bits for each user in the multi-user data packet so as to calculate the number $N_{avbits,u}$ of available bits. Here, the number $N_{pld,u}$ of data pad bits may be represented by Expressions 8 and 9.

$$N_{pld,u} = \text{length} \times 8 + 16 = (4 \cdot \text{VHT\_SIG\_B\_LENGTH}_u) \times 8 + 16 \quad \text{Expression 8}$$

$$N_{pld,u} = \text{length} \times 8 + 16 = (\text{PSDU\_LENGTH}_u) \times 8 + 16 \quad \text{Expression 9}$$

As illustrated in FIGS. 4 and 6, Expression 8 represents the number $N_{avbits,u}$ of available bits when the PSDU_LENGTH 300 or 500 is more than the 4×VHT-SIG B length 305 or 505, i.e., when the PSDU_LENGTH$_u$ calculated in Expression 6 and 7 is more than a 4VHT-SIG B length for each user 4·VHT_SIG_B_LENGTH$_u$ (PSDU_LENGTH$_u$≥4·VHT_SIG_B_LENGTH$_u$).

As illustrated in FIGS. 4 and 6, Expression 9 represents the number $N_{pld,u}$ of data pad bits when the PSDU_LENGTH 400 or 600 is more than the 4×VHT-SIG B length 405 or 605, i.e., when the PSDU_LENGTH$_u$ calculated in Expression 6 and 7 is smaller than the 4×VHT-SIG B length for each user 4·VHT_SIG_B_LENGTH$_u$ (PSDU_LENGTH$_u$<4·VHT_SIG_B_LENGTH$_u$).

After the number $N_{pld,u}$ of data pad bits is calculated, the encoding unit 120 calculates the number $N_{avbits,u}$ of available bits. The number $N_{avbits,u}$ of available bits may be represented by Expression 10

$$N_{avbits,u} = N_{CBPS,u} \times m_{STBC} \times \left\lceil \frac{N_{pld,u}}{N_{CBPS,u} \times R_u \times m_{STBC}} \right\rceil \quad \text{Expression 10}$$

In Expression 10, $N_{CBPS,u}$ denotes a number of coded bits per symbol for each user in the LDPS encoding, i.e., a number of codeword bits per symbol, and $R_u$ denotes a coding rate.

The encoding unit 120 calculates an integer number $N_{CW,u}$ of a codeword of the LDPC code to be transmitted to each user and a length $N_{LDPC,u}$ of the codeword of the LDPC code to be transmitted to each user. Then, the encoding unit 120 calculates a number $N_{shrt,u}$ of shortening bits for each user so as to pad data bits corresponding to the number $N_{pld,u}$ of data pad bits. The number $N_{shrt,u}$ of shortening bits may be represented by Expression 11.

$$N_{shrt,u} = \max(0, (N_{CW,u} \times L_{LDPC,u} \times R_u) - N_{pld,u}) \quad \text{Expression 11}$$

Next, the encoding unit 120 calculates a final number $N_{avbits,u}$ of available bits by updating the number $N_{avbits,u}$ of available bits, calculated using Expression 1, in consideration of the total number $N_{SYM}$ of data symbols in the data portion of the packet. The number of bits for puncture for each user, i.e., the number $N_{punc,u}$ of puncturing bits is calculated through the final number $N_{avbits,u}$ of available bits, calculated as described above. The final number $N_{avbits,u}$ of available bits may be represented by Expression 12, and the number $N_{punc,u}$ of puncturing bits may be represented by Expression 13.

$$N_{avbits,u} = N_{avbits,u} + N_{CBPS,u} \times m_{STBC} \times \left(N_{SYM} - \left\lceil \frac{N_{pld,u}}{N_{CBPS,u} \times R_u \times m_{STBC}} \right\rceil \right) \quad \text{Expression 12}$$

$$N_{punc,u} = \max(0, (N_{CW,u} \times L_{LDPC,u}) - N_{avbits,u} - N_{shrt,u}) \quad \text{Expression 13}$$

When the encoding unit 120 does not use an extra symbol in the encoding through the LDCP code as illustrated in FIGS. 5 and 6, a case where $$\left(N_{SYM} - \left\lceil \frac{N_{pld,u}}{N_{CBPS,u} \times R_u \times m_{STBC}} \right\rceil \right) = 0$$

may occur when the final number $N_{avbits,u}$ of available bits is calculated as illustrated in Expression 12.

The encoding unit 120 calculates a number of codeword bits, i.e., a number $N_{rep,u}$ of repeated codeword bits for the purpose of repetition through the LDPC code for each user. The number $N_{rep,u}$ of repeated codeword bits may be represented by Expression 14.

$$N_{rep,u} = \max(0, N_{avbits,u} - N_{CW,u} \times L_{LDPC,u} \times (1 - R_u) - N_{pld,u}) \quad \text{Expression 14}$$

The encoding unit 120 calculates the bit numbers described above, and encodes the multi-user data packet as the LDPC code by calculating the bit numbers described above. Particularly, the encoding unit 120 encodes the AMPDU subframes in the multi-user data packet as the LDPC code. As the length in LDPC encoding is determined by calculating the bit numbers in the LDPC encoding process for the multi-user data packet, the transmission unit 130 transmits, to the data receiving apparatus, the information on the length in LDPC encoding, corresponding to the LDPC encoding of the multi-user data packet. The decoding unit 220 decodes the received multi-user data packet corresponding to the encoding of the encoding unit 120. Particularly, the decoding unit 220 rapidly decodes the received multi-user data packet using the length in LDPC encoding, corresponding to the LDPC encoding of the multi-user data packet in the encoding unit 120. Hereinafter, an operation of the data transmitting apparatus for transmitting a multi-user data packet in the communication system in accordance with the embodiment of the present invention will be described in detail with reference to FIG. 7.

Figure 7:
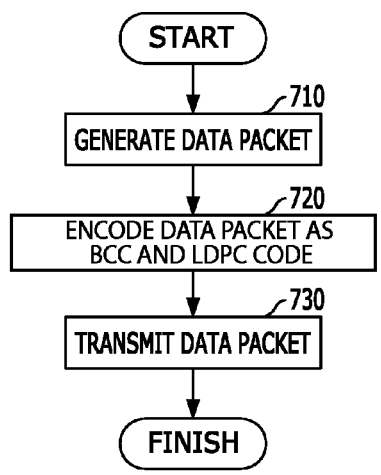
FIG. 7 is a flowchart schematically illustrating a method for transmitting data in a communication system in accordance with an embodiment of the present invention.

FIG. 7 is a flowchart schematically illustrating a method for transmitting data in a communication system in accordance with an embodiment of the present invention.

Referring to FIG. 7, at step 710, the data transmitting apparatus generates a multi-user data packet containing a large quantity of data to be transmitted to a plurality of users. Here, the multi-user data packet has been specifically described above, and therefore, its detailed description will be omitted.

At step 720, the data transmitting apparatus encodes the generated multi-user data packet using a predetermined encoding scheme. In this case, the data transmitting apparatus encodes the multi-user data packet through a BCC and an LDPC code. Particularly, the data transmitting apparatus encodes A-MPDU subframes in the multi-user data packet as the LDPC code. As described above, the data transmitting apparatus encodes the A-MPDU subframes in the multi-user data packet as the LDPC code by calculating the bit numbers in the LDPC encoding process. The LDPC encoding has been specifically described above, and therefore, its detailed description will be omitted.

At step 730, the data transmitting apparatus transmits the encoded multi-user data packet to a data receiving apparatus included in a terminal of each of the plurality of users. In this case, the data transmitting apparatus transmits, to the data receiving apparatus, a length in LDPC encoding, corresponding to the LDPC encoding of the multi-user data packet. Hereinafter, an operation of the data receiving apparatus for receiving a multi-user data packet in the communication system in accordance with the embodiment of the present invention will be described in detail with reference to FIG. 8.

Figure 8:
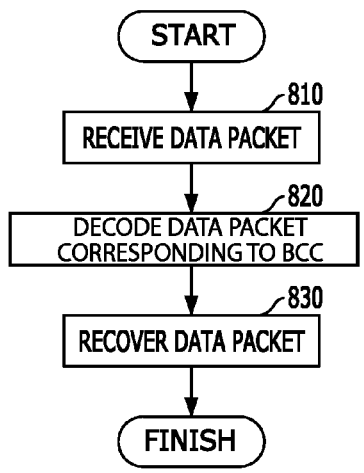
FIG. 8 is a flowchart schematically illustrating a method for receiving data in the communication system in accordance with the embodiment of the present invention.

FIG. 8 is a flowchart schematically illustrating a method for receiving data in the communication system in accordance with the embodiment of the present invention.

Referring to FIG. 8, at step 810, the data receiving apparatus receives a multi-user data packet transmitted from the data transmitting apparatus as described above.

At step 820, the data receiving apparatus decodes the received multi-user data packet corresponding to the encoding scheme in the data transmitting apparatus. Here, the multi-user data packet is decoded through the BCC and the LDPC code as described above. Particularly, as the A-MPDU subframes in the multi-user data packet are encoded as the LDPC code, the data receiving apparatus decodes the multi-user data packet using the information on the length in LDPC encoding. Here, the decoding of the multi-user data packet using the information on the length in LDPC encoding has been specifically described above, and therefore, its detailed description will be omitted.

At step 830, the data receiving apparatus outputs data corresponding to each of the users by recovering the decoded multi-user data packet.

In accordance with the exemplary embodiments of the present invention, a multi-user data packet containing a large quantity of data to be transmitted to a plurality of users is encoded and decoded using an LDPC encoding scheme in the communication system, so that it is possible to reduce loss of information in a channel environment and to stably transmit/receive the multi-user data packet at a high speed. Particularly, MPDU subframes in the frame of the multi-user data packet are encoded and decoded using the LDPC encoding scheme, so that it is possible to improve a data processing rate and reduce data error rate through normal transmission/reception of a large quantity of data.

While the present invention has been described with respect to the specific embodiments, it will be apparent to those skilled in the art that various changes and modifications may be made without departing from the spirit and scope of the invention as defined in the following claims.

What is claimed is:

1. An apparatus for transmitting data in a communication system, the apparatus comprising:
   a generation unit configured to generate, using a processor, a multi-user data packet including data to be transmitted to a plurality of users, the multi-user data packet including a plurality of medium access control (MAC) protocol data unit (MPDU) subframes, the plurality of MPDU subframes corresponding to the plurality of users;
   an encoding unit configured to encode, using a processor, the multi-user data packet as a binary convolutional code (BCC) and a low-density parity check (LDPC) code; and
   a transmission unit configured to transmit the encoded multi-user data packet to the plurality of the users,
   wherein the encoding unit performs LDPC encoding on the multi-user data packet, and then performs BCC encoding on the LDPC encoded multi-user data packet, and
   wherein the encoding unit encodes a MPDU subframe in the multi-user data packet, which corresponds to one of the plurality of users, as the LDPC code.

2. The apparatus of claim 1, wherein the transmission unit transmits information on a length in LDPC encoding, corresponding to the encoding of the multi-user data packet as the LDPC code.

3. The apparatus of claim 2, wherein the encoding unit calculates a maximum value of the BCC and a maximum value of the LDPC code among the plurality of users and then determines a total number of symbols of the multi-user data packet among the maximum values, and calculates a length of a PHY (physical) service data unit (PSDU) based on the total number of symbols of the multi-user data packet.

4. The apparatus of claim 3, wherein the encoding unit calculates a length of the PSDU according to whether or not an extra symbol is used in the LDPC encoding.

5. The apparatus of claim 2, wherein the encoding unit calculates a number of available bits of orthogonal frequency division multiplexing (OFDM) symbols for each of the plurality of users in the multi-user data packet, and calculates a number of data pad bits for each of the plurality of users in the multi-user data packet.

6. The apparatus of claim 5, wherein the encoding unit calculates an integer number of a codeword of the LDPC code and a length of the codeword for each of the plurality of users in the multi-user data packet.

7. The apparatus of claim 6, wherein the encoding unit calculates a number of shortening bits for each of the plurality of users in the multi-user data packet, based on the number of data pad bits, the integer number of the codeword, and the length of the codeword.

8. The apparatus of claim 7, wherein the encoding unit calculates a number of puncturing bits for each of the plurality of users in the multi-user data packet, based on the number of data pad bits, the integer number of the codeword, the length of the codeword, and the number of shortening bits.

9. The apparatus of claim 6, wherein the encoding unit calculates a number of repeated codeword bits for each of the users in the multi-user data packet, based on the number of available bits, the integer number of the codeword, the length of the codeword, and the number of data pad bits.

10. An apparatus for receiving data in a communication system, the apparatus comprising:
    a reception unit configured to receive a multi-user data packet including data to be transmitted to a plurality of users;
    a decoding unit configured to decode, using a processor, the multi-user data packet, the multi-user data packet corresponding to a BCC and an LDPC code; and
    a recovery unit configured to recover, using a processor, the decoded multi-user data packet to data corresponding to the plurality of users,
    wherein the decoding unit performs BCC decoding on the multi-user data packet, and then performs LDPC decoding on the BCC decoded multi-user data packet
    wherein the decoding unit decodes the multi-user data packet in which an MPDU subframe corresponding to one of the plurality of users is encoded as the LDPC code.

11. The apparatus of claim 10, wherein the decoding unit decodes the multi-user data packet using information on a length in LDPC encoding, corresponding to the encoding of the multi-user data packet as the LDPC code.

12. A method for transmitting data in a communication system, the method comprising:
    generating a multi-user data packet including data to be transmitted to a plurality of users, the multi-user data packet including a plurality of MPDU subframes, the plurality of MPDU subframes corresponding to the plurality of users;
    encoding the multi-user data packet as a BCC and an LDPC code; and
    transmitting the encoded multi-user data packet to the plurality of users,
    wherein said encoding of the multi-user data packet comprises:
    performing LDPC encoding on the multi-user data packet; and performing BCC encoding on the LDPC encoded multi-user data packet, and wherein said encoding of the multi-user data packet comprises encoding an MPDU subframe in the multi-user data packet that corresponds to one of the plurality of users, as the LDPC code, and calculating information on a length in the LDPC encoding, corresponding to the encoding of the multi-user data packet as the LDPC code.

13. The method of claim 12, wherein said encoding of the multi-user data packet comprises:

calculating a maximum value of the BCC and a maximum value of the LDPC code among the plurality of users and then determining a total number of symbols of the multi-user data packet among the maximum values; and calculating a length of a PSDU based on the total number of symbols of the multi-user data packet.

14. The method of claim 13, wherein said encoding of the multi-user data packet comprises calculating the length of the PSDU according to whether or not an extra symbol is used in the LDPC encoding.

15. The method of claim 12, wherein said encoding of the multi-user data packet comprises:

calculating a number of available bits of OFDM symbols for each of the plurality of users in the multi-user data packet; and calculating a number of data pad bits for each of the plurality of users, in the multi-user data packet.

16. The method of claim 15, wherein said encoding of the multi-user data packet comprises calculating an integer number of a codeword of the LDPC code and a length of the codeword for each of the plurality of users, in the multi-user data packet.

17. The method of claim 16, wherein said encoding of the multi-user data packet comprises calculating a number of shortening bits for each of plurality of users in the multi-user data packet, based on the number of data pad bits, the integer number of the codeword, and the length of the codeword.

18. The method of claim 17, wherein said encoding of the multi-user data packet comprises calculating a number of puncturing bits for each of the plurality of users in the multi-user data packet, based on the number of data pad bits, the integer number of the codeword, the length of the codeword, and the number of shortening bits.

19. The method of claim 16, wherein said encoding of the multi-user data packet comprises calculating a number of repeated codeword bits for each of plurality of users in the multi-user data packet, based on the number of available bits, the integer number of the codeword, the length of the codeword, and the number of data pad bits.

20. A method for receiving data in a communication system, the method comprising:

receiving a multi-user data packet including data to be transmitted to a plurality of users;

decoding the multi-user data packet, corresponding to a BCC and an LDPC code; and recovering the decoded multi-user data packet to data corresponding to the plurality of users, wherein said decoding of the multi-user data packet comprises:

performing BCC decoding on the multi-user data packet; and performing LDPC decoding on the BCC decoded multi-user data packet, and wherein said decoding of the multi-user data packet comprises decoding the multi-user data packet in which an MPDU subframe corresponding to each one of the plurality of users are encoded as the LDPC code, using information on a length in the LDPC encoding corresponding to the encoding of the multi-user data packet as the LDPC code.

* * * * *